United States Patent [19]

Stone

[11] Patent Number: 4,555,193
[45] Date of Patent: Nov. 26, 1985

[54] KEYBOARDS INCLUDING COLOR CODING AND ONE HANDED OPERATION

[76] Inventor: Philip J. Stone, 70 Francis Ave., Cambridge, Mass. 02138

[21] Appl. No.: 546,884

[22] Filed: Oct. 31, 1983

[51] Int. Cl.[4] ............................................. B41J 5/10
[52] U.S. Cl. ................................. 400/486; 400/83; 400/88; 400/100; 400/472; 400/487; 400/489; 340/365 R
[58] Field of Search ............ 400/83, 87, 88, 91, 400/92, 93, 94, 100, 101, 102, 472, 482, 483, 485, 486, 487, 489; 340/365 R, 365 VL, 365 S, 365 C, 365 L, 365 P, 365 A, 365 E; 178/79; 434/227, 231

[56] References Cited

U.S. PATENT DOCUMENTS

| | | | |
|---|---|---|---|
| 706,002 | 8/1902 | Allen | 400/487 |
| 1,030,020 | 6/1912 | Schmitt | 400/487 |
| 1,319,687 | 10/1919 | Bates | 434/231 |
| 3,225,883 | 12/1965 | Ayres | 400/94 |
| 3,235,055 | 2/1966 | Pagenkopf | 400/483 |
| 3,833,765 | 9/1974 | Hilborn | 178/79 |
| 3,967,273 | 6/1976 | Knowlton | 400/486 X |
| 4,005,388 | 1/1977 | Morley et al. | 340/365 R X |
| 4,042,777 | 8/1977 | Bequaert | 178/79 |
| 4,055,755 | 10/1977 | Nakamura et al. | 364/705 |
| 4,180,337 | 12/1979 | Otey, III et al. | 400/486 |
| 4,202,038 | 5/1980 | Petersson | 340/365 R X |
| 4,310,839 | 1/1982 | Schwerdt | 340/365 R X |
| 4,360,892 | 11/1982 | Endfield | 364/900 |
| 4,381,502 | 4/1983 | Prame | 340/365 R |
| 4,458,238 | 7/1984 | Learn | 400/87 X |

FOREIGN PATENT DOCUMENTS

| | | | |
|---|---|---|---|
| 134703 | 5/1931 | Austria | 400/487 |
| 716957 | 10/1931 | France | 400/487 |
| 0058634 | 4/1983 | Japan | 340/365 R |

OTHER PUBLICATIONS

Byte (The Small Systems Journal), Apr. 1982, vol. 7, No. 4, a McGraw-Hill publication, 5 pages reprint.
IBM Technical Disclosure Bulletin, "Interactive Complex Transaction Keyboard and Display", Svigals, vol. 24, No. 2, Jul. 1981, pp. 1224-1226.

Primary Examiner—Ernest T. Wright, Jr.
Attorney, Agent, or Firm—Charles E. Pfund; Robert M. Asher

[57] ABSTRACT

A keyboard is disclosed having keys subdivided into one or more fields. Two keys from the same field concurrently actuated identify a particular character. Characters are also identified by the actuation of a single key independently of any other key. Pivot keys may be included which are a part of more than one field. A color coding arrangement makes the two key combination unambiguously suggested by the keyboard itself. These features make possible a reduction of the number of keys such that a full set of alphanumeric characters may be arranged on the keyboard for one handed operation.

23 Claims, 2 Drawing Figures

KEYBOARDS INCLUDING COLOR CODING AND ONE HANDED OPERATION

BACKGROUND OF THE INVENTION

This invention relates to keyboards, particularly ones suited for use with one hand. The invention uses color coding to reduce the number of keys on the keyboard to make it suitable for one hand.

The need for a one-handed keyboard has long been recognized. A one-handed keyboard was developed in U.S. Pat. No. 3,833,765, to Hilborn et al. for use by aircraft controllers who greatly benefit from having only one hand occupied. This keyboard uses a large number of key combinations based on the ICAO phonetic alphabet. Another device specifically designed for word processing was developed by Endfield in U.S. Pat. No. 4,360,892. Endfield's device uses key arrangements that vaguely suggest the shape of letters. This device uses only six keys and would require considerable training to use effectively.

A one-handed keyboard developed by Bequaert et al. in U.S. Pat. No. 4,042,777 uses spatial relationships shown on the keys to provide the necessary number of combinations to complete a set of alphanumeric characters. This requires a considerable amount of printing on its small keys to identify the character which results from each combination. To obtain any of the large number of combinations, fingers press more than one key at a time. The thumb may press either of four keys or any two adjacent keys while a finger concurrently presses one key, two keys next to each other or is positioned at the intersection of four adjacent keys to press all four at once.

Another solution to the one-handed keyboard problem was made by Prame in U.S. Pat. No. 4,381,502. This device uses sequence recording circuitry to obtain its increased number of combinations. For instance if Key B is pressed after Key A, a different character will be produced than if Key A is pressed after Key B.

An expanding need for one-handed keyboards is expected. The miniaturization of computing equipment is leading to the production of pocket-sized telecomputing systems. Attempts are being made to put full typewriter keyboards into such a pocket sized device, however, these are very difficult to use because of the small size and proximity of the keys. Therefore, a method has been needed for reducing the number of keys on a telecomputing system so that it can be easily operated. Once this has been done, telecomputing systems can be widely used to send and receive messages and perform simple computing tasks while being both easily portable and operable with one hand.

The preferred embodiment of the present invention uses color coding to reduce the number of keys. In an early keyboard color arrangement pattern, Allen, in U.S. Pat. No. 706,002, developed a keyboard that associated key colors with letter combinations. In 1919, U.S. Pat. No. 1,319,687, to Bates, used colors as an aid in teaching touch typewriting with a different color for each finger stall. This was also pursued by Bloem in French Patent No. 716,957 which used colored keyboards as a teaching heuristic.

None of the above keyboards has reduced the number of keys on a one-handed device in such a way as to enable any person who picks up the device to access the entire set of alphanumeric characters without significant training.

SUMMARY OF THE INVENTION

This invention is directed to a keyboard that divides its keys into a plurality of fields. Each field of keys includes a number of single-field keys. It is possible to identify a character by activating two single-field keys from the same field concurrently. A character may also be identified by actuating a key independently of any other key. A further enhancement of the invention includes pivot keys which belong to more than one field of keys. The pivot keys may be actuated concurrently with keys from any of the fields to which it belongs to identify a character. The use of fields and pivot keys has reduced the number of keys required to produce the alphanumeric characters on a display screen.

The present invention is more particularly directed to a color-coded one-handed keyboard for selecting from a variety of characters. The keys of the keyboard are subdivided into a plurality of fields in which each of the keys within one of said fields has a background color different from that of every other key within that field. Characters are printed on each of the keys with a particular color. To select a specific character, the key upon which the character is printed must be actuated concurrently with the key from within the same field that has a background color identical to the color of the character. If the character is a color which does not appear as a background color on another key, then that character is selected by actuating the key on which it is printed independently of any other key. This arrangement provides a keyboard which may be used without significant training. The color coding makes the selection of characters evident to the user from the face of the keyboard. The use of fields allows colors to be reused in each field so that the total number of colors can be minimized.

According to a further feature of the invention, a visual display (such as a battery powered, liquid crystal display) is positioned on the keyboard so as to be surrounded by a plurality of keys. A menu of items may be displayed on the display so that by actuating one of the plurality of adjacent keys one of the items being displayed may be selected, according to the proximity of the key to the item.

According to a still further feature of the invention, the characters of the alphabet are arranged on the keys so that the high frequency characters are actuated by a single actuation of a key independently of any other key. For example, the vowels "A", "E", "I" and "O" are actuated by a single key independently of any other key.

The present invention has a reduced number of keys that can be actuated by one hand and the selection of the appropriate keys is made easy by a method of color coding. Other objects and advantages of the invention will become apparent during the following description of the presently preferred embodiment of the invention taken in conjunction with the drawing.

DETAILED DESCRIPTION OF THE PREFERRED EMBODIMENT

Figure 1:
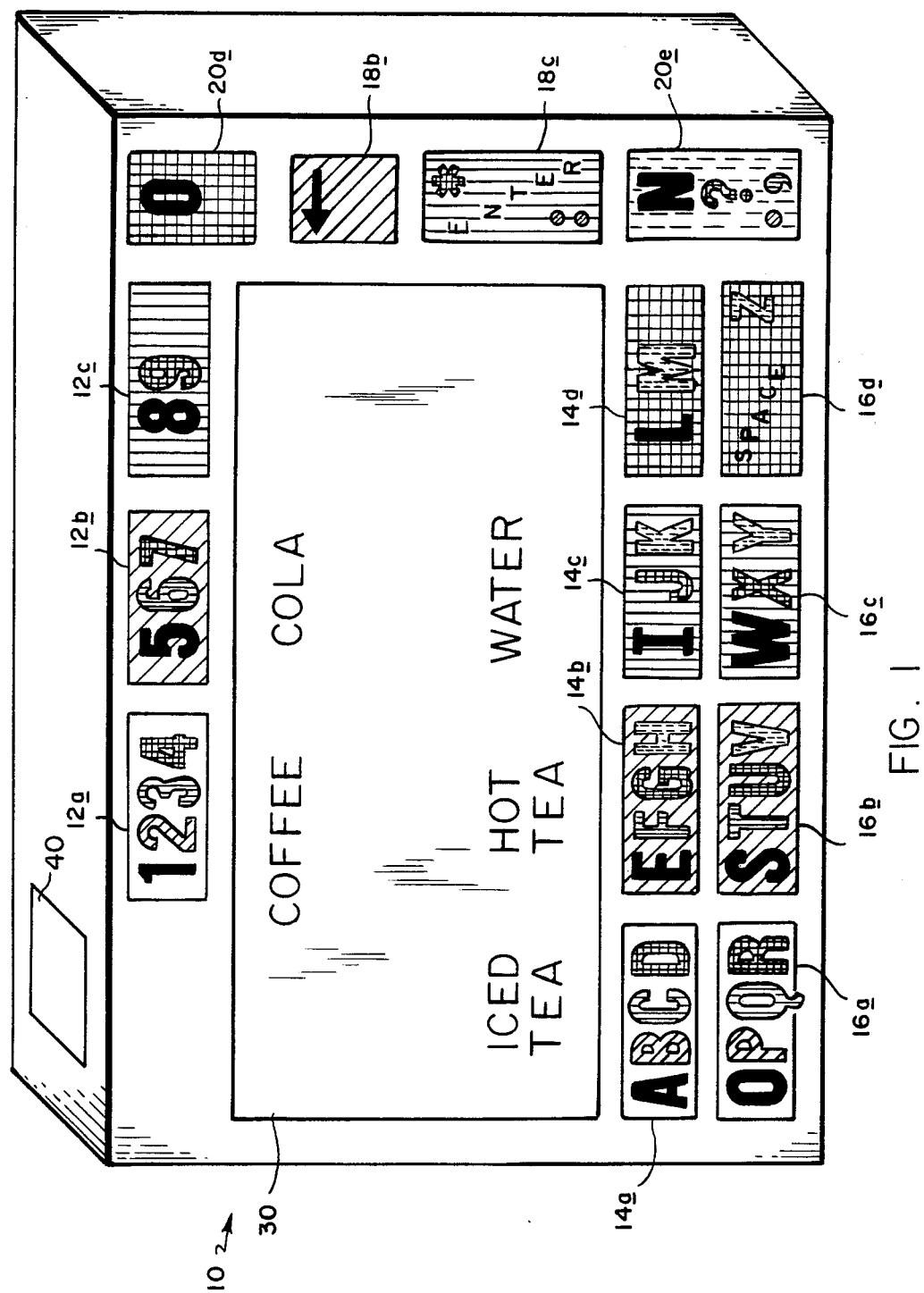
FIG. 1 is a diagram of the keyboard of the present invention and FIG. 2 is a schematic representation of the fields of the keyboard of FIG. 1.

The arrangement of the keys 12a-c, 14a-d, 16a-d, 18d, 18c, 20d, 20e on a keyboard 10 of the present invention is shown in FIG. 1. The keyboard 10 may be used as a hand-held telecomputing terminal. Short messages may be received and sent by such a terminal through a transmitter 40 on the terminal, for instance, an infrared transmitter. The keyboard 10 may be electronically implemented by any appropriate means known to those skilled in the art.

Figure 2:
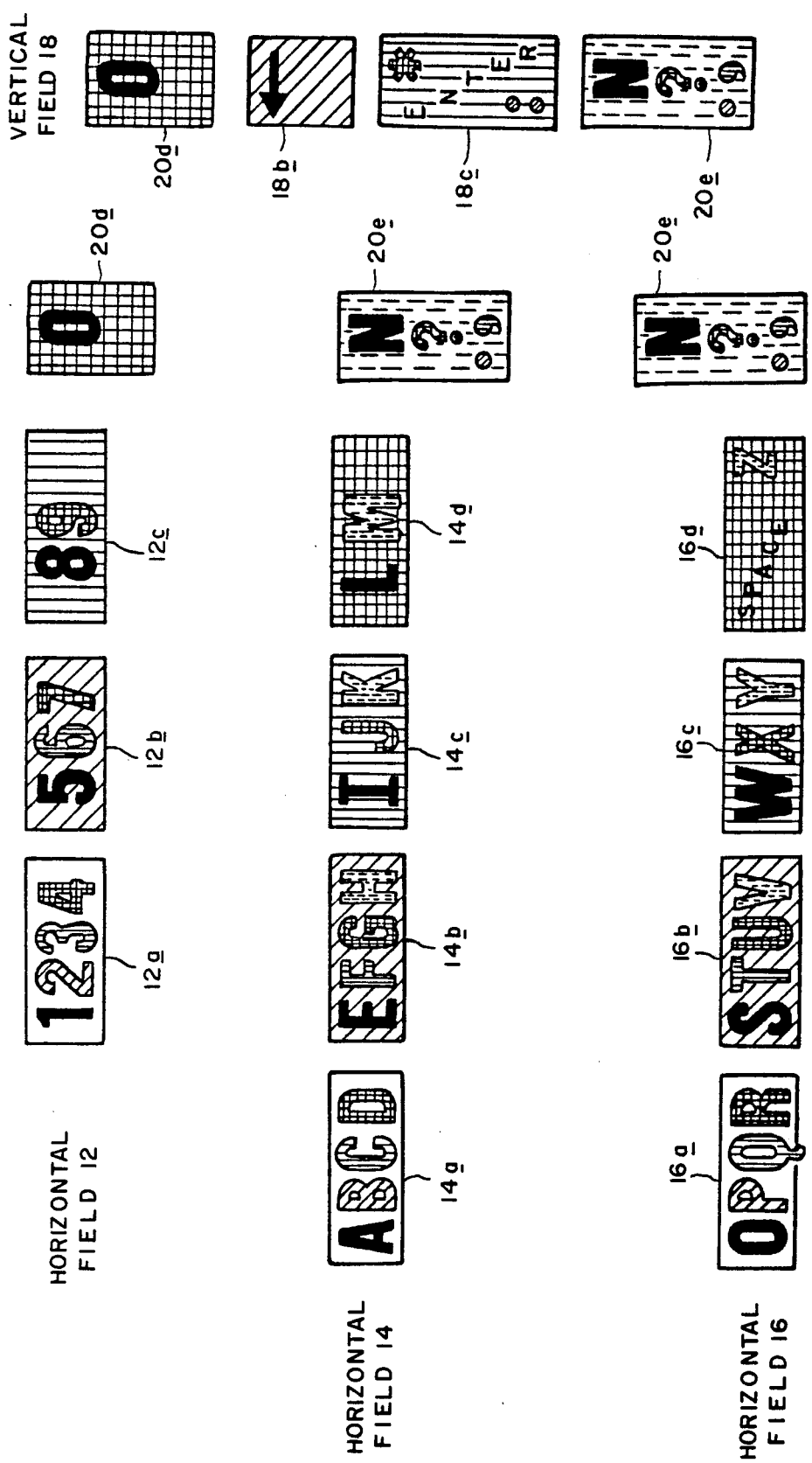

The keys 12a-c, 14a-d, 16a-d, 18b, 18c, 20d, 20e of the keyboard 10 are divided into a plurality of fields 12, 14, 16, 18 as schematically shown in FIG. 2. The preferred arrangement includes three horizontal fields 12, 14, 16 and one vertical field 18. Each field includes a number of single-field keys 12a-c, 14a-d, 16a-d and 18b-c. Within each field, each key has a background color different from the background color of any other key in that field. Each of the background colors used on the different keys of the figures is represented by a small alphabetic character, thus, the keys 12a, 14a and 16a have the same background color. Colors are shown in the figures through the use of different shading or cross-hatching patterns for each color. For the purposes of this patent application, black and white are considered colors. In the preferred embodiment, five background colors are used in the keyboard 10. Colors should be preferably selected so that they can be distinguished by people not possessing good color discrimination.

A particular character may be identified by the actuation of two single-field keys form the same field concurrently. A character printed in a particular color on one of the keys is selected by actuation of the key on which it is printed concurrently with actuation of the key from within the same field whose background color is the color of the character. For example, in the preferred embodiment shown in the figures, to identify the letter "B" key 14a and key 14b are concurrently actuated. This is simply determined since the color of the letter "B" as it is printed on key 14a is the same color as the background color of key 14b from the same field.

A letter printed in a color other than the background color of any of the keys is selected by actuating the key upon which it is printed independently of any other key. It is presently preferred that characters which may be actuated by a single key be colored black. Thus, to obtain the letter "A" key 14a is actuated by itself. Likewise, the letters "E", "I", "L", "N", "O", "S" and "W" are selected by the independent actuation of the key upon which they are printed. Independent actuation also obtains the numbers "1", "5", "8" and "0" and the functions "SPACE", "ENTER" and backspace "←". Since the vowels "A", "E", "I" and "O" and the consonants "S" and "W" are characters which occur with a high frequency in the English written language it is especially convenient to have them as the characters which may be easily selected by a single key actuation.

The number of keys necessary to select from the large variety of alphanumeric characters is further minimized by allowing for overlapping fields. The overlapping fields are made possible by the provision of pivot keys 20d and 20e. A pivot key belongs to a plurality of fields as shown in FIG. 2 for pivot keys 20d and 20e. For example, the pivot key 20d belongs to the horizontal field 12 of keys 12a, 12b and 12c and the vertical field 18 of keys 18b, 18c and 20e. Pivot key 20e belongs to the vertical field 18 and to the two horizontal fields 14 and 16. As with any of the other keys on the keyboard 10, the pivot keys 20d, 20e may be actuated independently of any other key to select the character printed on that key which is in a color different from any of the background colors of the keys. For example, in the keyboard 10 of FIG. 1 "0" is selected by actuating only pivot key 20d and "N" is selected by actuating pivot key 20e. Either of the pivot keys 20d, 20e may also be actuated concurrently with a key from any of the fields to which it belongs. For example, the number "4" is printed on key 12a in the same color as the background color of pivot key 20d. Thus by actuating keys 12a and 20d concurrently, the number "4" is selected. Likewise, the asterisk on key 18c is printed in the color of the background of pivot key 20d. Thus, by concurrently actuating keys 18c and 20d an asterisk is selected.

When a plurality of characters is printed on a pivot key, the orientation of the pivot key identifies the field from which to choose a second key. The operator does not have a choice of any of the keys in any field to which the pivot key belongs. Selection of the characters on a pivot key is made by actuating the pivot key and another key from the field which is particularly identified by the orientation of the pivot key itself. For example, in the preferred embodiment, the pivot key 20e has a plurality of characters printed upon it. The vertical orientation of the pivot key 20e means that the second key for these characters is to be chosen from the vertical field 18. To obtain one of the characters on pivot key 20e, the pivot key 20e must be actuated concurrently with the key in the vertical field 18 having a background color identical to the color of the character. For example to obtain a "," in the preferred embodiment, key 18c must be concurrently actuated with pivot key 20e. It is a general rule applicable to all of the keys in the preferred embodiment shown in the drawing that the field from which a second key is to be chosen is within the field identified by the orientation of the key. Thus, the user can easily identify from the orientation of a key which field he should look at in order to find the corresponding key to obtain a particular character.

The selection of the appropriate keys to obtain a particular character can be summarized as follows. A user will first look to the key upon which the desired character is printed. This key will be actuated by the user. If the desired character is printed in a color different from any of the background colors of the keys, no other key needs to be actuated. The actuation of the single key will cause the selected character to be printed on the display 30.

To obtain one of the other characters printed on a key, the user will look to the field of keys to which this key belongs to find the key having a background color identical to the color of the desired character. The field to which a key belongs is determined by position, orientation or some other visually obvious criterion. The other key is actuated concurrently with the key upon which the desired character is printed to select the desired character.

Instead of color, position of a character in the list of characters on a key may be used to identify the keys to be actuated for that character. For example, in the horizontal fields 12, 14, 16 the leftmost character on the key is selected by actuating the single key independently of any other. The second character is selected by concurrent actuation with the neighboring key to the right.

The third character is selected by concurrent actuation with the key two positions to the right and so on.

The following chart fully identifies the selection process for the embodiment shown in the figures. For each character, symbol or function the appropriate key combination is given.

| Character | Key Combination |
|---|---|
| A | 14a |
| B | 14a, 14b |
| C | 14a, 14c |
| D | 14a, 14d |
| E | 14b |
| F | 14b, 14c |
| G | 14b, 14d |
| H | 14b, 20e |
| I | 14c |
| J | 14c, 14d |
| K | 14c, 20e |
| L | 14d |
| M | 14d, 20e |
| N | 20e |
| O | 16a |
| P | 16a, 16b |
| Q | 16a, 16c |
| R | 16a, 16d |
| S | 16b |
| T | 16b, 16c |
| U | 16b, 16d |
| V | 16b, 20e |
| W | 16c |
| X | 16c, 16d |
| Y | 16c, 20e |
| Z | 16d, 20e |
| Space | 16d |
| 1 | 12a |
| 2 | 12a, 12b |
| 3 | 12a, 12c |
| 4 | 12a, 20d |
| 5 | 12b |
| 6 | 12b, 12c |
| 7 | 12b, 20d |
| 8 | 12c |
| 9 | 12c, 20d |
| 0 | 20d |
| ←(backspace) | 18b |
| * | 18c, 20d |
| : | 18c, 18b |
| ENTER | 18c |
| ? | 20e, 20d |
| . | 20e, 18b |
| , | 20e, 18c |

The electronics for producing the combinatory encoding for this terminal can be achieved by methods known to those in the art. The use of combination keys on a keyboard is known, as evidenced by such keys as the shift key or the control key on a computer keyboard. The electronics interacting with the keyboard 10 will be arranged so that the cursor advance is delayed until the character selection is completed. This allows a second key to be pressed at any time after the first is pressed to change the single key character representation to the character identified by the two-key combination before the cursor is advanced. Two alternatives are available for the production of successive characters. In one, nothing new may be registered until all keys have been released and the new keys are pressed. Alternatively, the next character may be indicated as soon as a new key is pressed after one key is released. This alternative permits a common color key in a field to be held down across successive characters in the same field. The character that remains when the cursor advances represents the key or key combination regardless of the sequence of key actuation that was depressed before any of the keys was released.

Further selection possibilities are created by the provision of a display 30 adjacent to a plurality of keys 12a-c, 20d, 18b-c, 14a-d. Inasmuch as the terminal may be used in conjunction with a wide variety of communication software programs, the meaning of the keys can be changed with context of usage. The keys 12a-c, 20d, 18b-c, 14a-d, which are adjacent to the visual display 30, may be used to select from a menu of items displayed on the display 30. A selection would be made by pressing the key which is most proximate the desired menu selection. There are many possibilities for making use of this feature. For example, the telecomputing terminal may be used by a businessman to select from a menu of different flight times being sent to his terminal by his travel agent. In the embodiment shown in FIG. 1, the terminal is displaying a menu of refreshments. A person involved in a meeting can use the terminal to communicate with someone outside the meeting. The selection process may be made without interrupting the meeting as the person merely has to pull his terminal out of his or her pocket and press the appropriate keys. A choice of items can be made by pressing the key closest to the displayed item. For example, if water is desired,, the user depresses key 14c.

The keyboard of the present invention is advantageously arranged so that it may be operated by a single hand. Thus while one hand holds the terminal from underneath the other hand may be used to operate the keys. Thus, the terminal may be used without a table on which to place it. This allows it to be used while a person is standing on line, for example.

The invention being thus described, it will be obvious that the same may be varied in many ways. For example, the number and the location of the fields may be rearranged, and the lettering and coloring may be changed to suit the particular device. These and other changes can be made without departing from the spirit and the scope of the invention and without diminishing attendant advantages. It is therefore intended that such changes and modifications be covered by the following claims.

I claim:

1. A keyboard for selecting characters from a variety of characters including all the letters of an alphabet, said keyboard comprising:
a plurality of fields of keys, each field including a plurality of single-field keys which identify a particular character when actuated concurrently with one other of said single-field keys from within the same field, said plurality of fields of keys being arranged for operation by one hand wherein each key has a background color and each character is printed on a key in a particular color so that actuation of a key upon which a character is printed concurrently with actuation of a key in the same field whose background color is identical to the color of said character causes the selection of said character.

2. A one-handed keyboard for selecting characters from a variety of characters, said keyboard comprising:
a plurality of keys subdivided into a plurality of fields, each one of said keys within one of said fields having a background color different from every other key within said one of said fields, and where characters, printed in a particular color on one of said keys, are selected by actuation of the key upon which the character is printed concurrently with actuation of a key from within the same field whose background color is the color of said character.

3. The keyboard of claim 2 wherein a character, printed on a key in a color not found as a background color for any other key, is selected by actuating the key, upon which said character is printed, independently of any other key.

4. The keyboard of claim 2 wherein one of said keys belongs to a plurality of said fields.

5. The keyboard of claim 2 wherein one of said keys belongs to three of said fields.

6. The keyboard of claim 2 wherein one of said fields includes two keys which also belong to other fields.

7. The keyboard of claim 3 wherein each character printed on a key in a color not found as a background for any other key comprises a high frequency character.

8. The keyboard of claim 7 wherein said high frequency characters include A, E, I, O, S and W.

9. The keyboard of claim 2 further comprising a visual display adjacent a plurality of keys from said plurality of keys.

10. A one-handed keyboard for selecting characters from a variety of characters including a complete set of alphanumeric characters, said keyboard comprising:

a plurality of keys subdivided into three horizontal fields of keys and one vertical field of keys, each one of said keys within one of said fields having a background color different from every other key within said one of said fields, and each character being printed on a key in a particular color so that selection of a character is made by actuating a first key, upon which said character is printed, independently of any other key when the color of the character is not found as the background color of any other key and, where the color of the character is a background color of another key, selection is made by actuating said first key upon which said character is printed, concurrently with a second key, from the field in which said first key is oriented, whose background color is the color of said character.

11. The keyboard of claim 10 wherein said vertical field of keys shares one of said keys with one horizontal field and shares another of said keys with the two other horizontal fields.

12. The keyboard of claim 10 wherein the characters printed on a key in a color not found as a background color for any other key comprise characters which appear with high frequency in a written language.

13. The keyboard of claim 12 wherein said characters which appear with high frequency include A, E, I, O, S and W.

14. The keyboard of claim 10 further comprising a visual display adjacent a plurality of said keys.

15. A keyboard for selecting characters from a variety of characters comprising:

a plurality of fields of keys, the keys of each field including a plurality of single-field keys, each key having a background color and each character being printed on a key in a particular color so that actuation of a key upon which a character is printed concurrently with actuation of a key in the same field whose background color is identical to the color of said character causes the selection of said character.

16. The keyboard of claim 15 wherein at least two of said fields of keys include a pivot key which belongs to a plurality of said fields such that each said pivot key identifies a particular character when actuated concurrently with another key from within one of the fields to which said actuated pivot key belongs.

17. The keyboard of claim 15 wherein said characters are printed on said keys so that the position of a character printed on a key indicates which other key in the same field should be actuated concurrently with said key to select said character.

18. The keyboard of claim 15 wherein a character printed on a key in a color not found on any other key is selected by actuating the key, upon which said character is printed, independently of any other key.

19. A keyboard for selecting characters from a variety of characters comprising:

at least one field of keys, each field including a plurality of keys, each key having a background color and each character being printed on a key in a particular color so that actuation of a key upon which a character is printed concurrently with actuation of a key in the same field whose background color is identical to the color of said character causes the selection of said character.

20. The keyboard of claim 19 wherein a character printed on a key in a color not found on any other key is selected by actuating the key, upon which said character is printed, independently of any other key.

21. The keyboard of claim 19 wherein said characters are printed on said keys so that the position of a character printed on a key indicates which other key in the same field should be actuated concurrently with said key to select said character.

22. The keyboard of claim 19 further comprising a visual display adjacent a plurality of keys from said at least one field of keys.

23. The keyboard of claim 19 wherein said at least one field of keys is arranged for operation by one hand.

* * * * *